US007639025B2

(12) United States Patent
Hanson et al.

(10) Patent No.: US 7,639,025 B2
(45) Date of Patent: Dec. 29, 2009

(54) COLLECTION OPTICS INTEGRATING AN OBJECTIVE AND A SIL

(75) Inventors: John Hanson, Mountain View, CA (US); Jonathan Frank, Los Gatos, CA (US); Dario Meluzzi, Mountain View, CA (US); Daniel Cotton, Walnut Creek, CA (US)

(73) Assignee: DCG Systems, Inc., Fremont, CA (US)

( * ) Notice: Subject to any disclaimer, the term of this patent is extended or adjusted under 35 U.S.C. 154(b) by 63 days.

(21) Appl. No.: 11/497,153

(22) Filed: Jul. 31, 2006

(65) Prior Publication Data
US 2006/0261829 A1  Nov. 23, 2006

Related U.S. Application Data

(63) Continuation of application No. 10/930,454, filed on Aug. 31, 2004, now Pat. No. 7,123,035, which is a continuation-in-part of application No. 10/255,345, filed on Sep. 26, 2002, now Pat. No. 6,828,811.

(60) Provisional application No. 60/371,542, filed on Apr. 10, 2002.

(51) Int. Cl.
*G01R 31/02* (2006.01)
*G01N 21/01* (2006.01)
*G06K 9/00* (2006.01)

(52) U.S. Cl. .................. 324/754; 356/244; 382/144

(58) Field of Classification Search .............. None
See application file for complete search history.

(56) References Cited

U.S. PATENT DOCUMENTS

| | | | |
|---|---|---|---|
| 3,524,694 A | 8/1970 | Kelin | |
| 3,711,186 A | 1/1973 | O'Connor | |
| 3,912,378 A | 10/1975 | Goto | |
| 4,615,620 A * | 10/1986 | Noguchi et al. | 356/626 |
| 4,634,234 A | 1/1987 | Baumann | |
| 5,004,307 A | 4/1991 | Kino et al. | |
| 5,125,750 A | 6/1992 | Corle et al. | |
| 5,208,648 A | 5/1993 | Batchelder | |
| 5,220,403 A | 6/1993 | Batchelder | |

(Continued)

FOREIGN PATENT DOCUMENTS

JP  11-003534 A  1/1999

(Continued)

OTHER PUBLICATIONS

Birkbeck et al., "Laser Tweezer Controlled Solid Immersion Lens for High Resolution Imaging in Microfluidic and Biological Samples," University of California, San Diego.

(Continued)

*Primary Examiner*—Jermele M Hollington
(74) *Attorney, Agent, or Firm*—Nixon Peabody LLP.; Joseph Bach, Esq.

(57) ABSTRACT

A collection optics arrangement integrating an objective lens and a solid immersion lens. An objective lens housing has an objective lens mounted inside. A solid immersion lens (SIL) housing is slidably mounted onto said objective lens housing, and a solid immersion lens is mounted onto the SIL housing. A spring imparts resilient force resisting the sliding of the solid immersion lens housing with respect to the objective lens housing.

20 Claims, 5 Drawing Sheets

U.S. PATENT DOCUMENTS

| | | | |
|---|---|---|---|
| 5,282,088 | A | 1/1994 | Davidson |
| 5,475,316 | A | 12/1995 | Hurley et al. |
| 5,852,232 | A | 12/1998 | Samsavar et al. |
| 5,910,940 | A | 6/1999 | Guerra |
| 5,939,709 | A | 8/1999 | Ghislain et al. |
| 5,940,545 | A | 8/1999 | Kash et al. |
| 5,948,972 | A | 9/1999 | Samsavar et al. |
| 6,094,413 | A | 7/2000 | Guerra |
| 6,252,412 | B1 | 6/2001 | Talbot et al. |
| 6,301,055 | B1 | 10/2001 | Legrand et al. |
| 6,404,485 | B1 * | 6/2002 | Kubo et al. ............... 356/138 |
| 6,445,447 | B1 * | 9/2002 | Wang et al. ............. 356/237.2 |
| 6,445,453 | B1 * | 9/2002 | Hill ......................... 356/450 |
| 6,462,814 | B1 | 10/2002 | Lo |
| 6,507,433 | B2 | 1/2003 | Mecham et al. |
| 6,509,750 | B1 | 1/2003 | Talbot et al. |
| 6,591,121 | B1 | 7/2003 | Madarasz et al. |
| 6,594,430 | B1 * | 7/2003 | Rausch et al. ............. 385/129 |
| 6,621,275 | B2 | 9/2003 | Cotton et al. |
| 6,818,907 | B2 | 11/2004 | Stark |
| 6,828,811 | B2 * | 12/2004 | Hanson et al. ............. 324/754 |
| 6,831,782 | B2 | 12/2004 | Patton et al. |
| 6,841,096 | B2 * | 1/2005 | Quake et al. ............... 264/2.5 |
| 7,038,856 | B2 * | 5/2006 | Quake et al. ............... 359/661 |
| 7,123,035 | B2 * | 10/2006 | Hanson et al. ............. 324/754 |
| 7,224,828 | B2 * | 5/2007 | Cotton et al. ............. 324/754 |
| 7,327,452 | B2 * | 2/2008 | Frank et al. ............... 356/244 |
| 7,466,852 | B2 * | 12/2008 | Cotton et al. ............. 324/754 |
| 2006/0028641 | A1 * | 2/2006 | Frank et al. ............... 356/244 |

FOREIGN PATENT DOCUMENTS

| | | |
|---|---|---|
| JP | 11-273132 A | 10/1999 |
| JP | 2000-171611 | 6/2000 |
| JP | 2001-034998 | 2/2001 |
| JP | 2002-236087 | 8/2002 |
| WO | WO 97/41556 | 11/1997 |
| WO | WO 98/58288 | 12/1998 |
| WO | WO 2005-043210 A1 | 5/2005 |

OTHER PUBLICATIONS

Fletcher et al., "Microfabricated Silicon Solid Immersion Lens," *Journal of Microelectromechanical systems*, vol. 10, No. 3, Sep. 2001.

Ghislain et al., "Near-filed Photolithography with a Solid Immersion Lens," *Applied Physics Letters*, vol. 74, No. 4, Jan. 25, 1999.

Moehl et al., "Solid Immersion Lens-Enhanced Micro-Photoluminescence: principle and Applications," Institut fur Angewandte Physik, Universitat Karlsruhe, Karlsruhe, Germany, arXiv:physics/0207045v1, Jul. 11, 2002.

Aaron L. Birkbeck, et al., "Laser Tweezer Controlled Solid Immersion Lens for High Resolution Imaging in Microfluidic and Biological Samples," Jun. 1, 2005. University of California, San Diego.

Buller, G.S., et al., "All-Solid-State Microscope-Based System for Picosecond Time-Resolved Photoluminescence Measurements on II-VI Semiconductors," *Rev. Sci. Instrum.*, 1992, p. 2994, 63, (5).

Buller, G.S., et al., "Time-Resolved Photoluminescence Measurements in InGaAs/InP Multiple-Quantum-Well Structures at 1.3-m Wavelengths by Use of Germanium Single-Photon Avalanche Photodiodes," *Applied Optics*, 1996, vol. 35, No. 6.

Khurana, et al., "Analysis of Product Hot Electron Problems by Gated Emission Microscope," *IEEE/IRPS*, 1986.

Kume, H., et al., "Ultrafast Microchannel Plate Photomultiplier," *Appl. Optics*, 1988, vol. 27, No. 6, 15.

Charboneau, S., et al., "Two-Dimensional Time-Resolved Imaging with 100-ps Resolution Using a Resistive Anode Photomultiplier Tube," *Rev. Sci. Instrum.*, 1992, 63 (11).

Paniccia, Mario, et al., "Novel Optical Probing Technique for Flip Chip Packaged Microprocessors," *Proceedings of 1998 International Test Conference (ITC '98)*, Oct. 18-22, 1998, IEEE Catalog No. RS00191, Washington, D.C.

Vallett, Dave, et al., "Diagnosis and Characterization of Timing-Related Defects by Time-Dependent Light Emission," *Proceedings of 1998 International Test Conference (ITC '98)*, Oct. 18-22, 1998, IEEE Catalog No. RS00191, Washington, D.C.

Mertin, W., et al., "Contactless Gigahertz Testing," *Proceedings of 1998 International Test Conference (ITC '98)*, Oct. 18-22, 1998, IEEE Catalog No. RS00191, Washington, D.C.

Heinrich, H.K., et al., "Picosecond Noninvasive Optical Detection of Internal Electrical Signals in Flip-Chip-Mounted Silicon Integrated Circuits," *IBM J. Res. Develop.*, 1990, vol. 34, No. 2/3.

* cited by examiner

COLLECTION OPTICS INTEGRATING AN OBJECTIVE AND A SIL

RELATED APPLICATIONS

This application claims priority from, and is a continuation of U.S. application Ser. No. 10/930,454, filed Aug. 31, 2004, now U.S. Pat. No. 7,123,035, which is a Continuation in Part of, U.S. application Ser. No. 10/255,345, filed Sep. 26, 2002, now U.S. Pat. No. 6,828,811, which claims priority from Provisional Application Ser. No. 60/371,542, filed Apr. 10, 2002; the entire disclosures of which are incorporated herein by reference.

BACKGROUND OF THE INVENTION

1. Field of the Invention

The present invention relates to a system for accurate placement of collection optics in microscopes.

2. Description of the Related Art

Various microscopes are used in the art for imaging, testing, and examination of various microstructures. A common feature of these microscopes is that the obtained resolution depends on efficient collection of light from the inspected object. Accurate placing of the collection optics is also highly important for accurate focusing on the object to be inspected. Additionally, to obtain efficient collection of light, the collection optics needs to be accurately placed with respect to the object to be imaged.

While collection efficiency is highly important for many types of microscopes, it is imperative in one particular field: probing and testing of semiconductor microchips. Microchips need to be tested during the design and during the manufacturing stages. One type of testing relies on light emission from the microchip that is generated whenever a device, e.g., a transistor, on the microchip changes state. For further information on this phenomenon and it's investigation, the reader is directed to, for example:

All-Solid-State Microscope-Based System for Picosecond Time-Resolved Photoluminescence Measurements on II-VI semiconductors, G. S. Buller et al., Rev. Sci. Instrum. pp. 2994, 63, (5), (1992);

Time-Resolved Photoluminescence Measurements in InGaAs/InP Multiple-Quantum-Well Structures at 1.3 μm Wavelengths by Use of Germanium Single-Photon Avalanche Photodiodes, G. S. Buller et al., Applied Optics, Vol 35 No. 6, (1996);

Analysis of Product Hot Electron Problems by Gated Emission Microscope, Khurana et al., IEEE/IRPS (1986);

Ultrafast Microchannel Plate Photomultiplier, H. Kume et al., Appl. Optics, Vol 27, No. 6, 15 (1988); and Two-Dimensional Time-Resolved Imaging with 100-ps Resolution Using a Resistive Anode Photomultiplier Tube, S. Charboneau, et al., Rev. Sci. Instrum. 63 (11), (1992).

Notably, Khurana et al., demonstrated that photoluminescence emission coincides with the switching of a transistor, thereby showing that, in addition to failure analysis, the phenomenon can also be used for device debug and circuit design. See, also, U.S. Pat. No. 5,940,545 to Kash et al., disclosing a system for such an investigation.

As can be appreciated from the above-cited works, the light emission in semiconductor devices is very faint. Accordingly, various optical and detection schemes have been proposed to more efficiently collect the emission and reduce the noise, i.e., increase collection fidelity, bandwidth, and speed. For example, commercially available microchannel photomultipliers have been used to amplify the collected light by factors of a million or so. Also, avalanche diodes coupled to time-to-amplitude converters (TAC) have been used to provide high temporal resolution of the emission.

From the optics perspective, various attempts have been made to increase the collection of light and the resolution by increasing the numerical aperture (NA $n*\sin\theta$; n being the index of refraction and $\theta$ being the collection angle) of the objective lens. It has been long known that increasing the numerical aperture can be achieved by increasing the index of refraction, n, to be above that of air. One historical method for increasing n is to fill the gap between the objective lens and the object with an index matching oil. Another method is to use an immersion lens between the object and the objective lens. Of course, one may use both techniques, i.e., use immersion lens and index matching fluid. The use of the above techniques is disclosed in, for example, U.S. Pat. Nos. 3,524,694, 3,711,186, and 3,912,378. More modern discussions of immersion lenses can be found in U.S. Pat. Nos. 4,634,234, 5,004,307, 5,208,648, 5,282,088 and Solid Immersion Microscopy, S. M. Mansfield, G. L. Report No. 4949, Stanford University 1992. Prior art immersion lenses are planoconvex (i.e., hemispheres). That is, the bottom surface, i.e., the surface facing the object, is flat, while the top surface, i.e., the surface facing the objective lens, is convex.

A semiconductor device of particular interest to the present invention is generally referred to as a "flip chip." Since the structure of flip chips is known, it will not be discussed here in detail. Information relating to flip chips can be found in, for example, http://www.flipchip.com and http://world.std.com/~hycomp/flippage.html. Of specific interest is recent effort in the art to inspect such devices from the back side, i.e., from the substrate side. One problem in testing flip chips using conventional methods, such as e-beam testing, is that the metal lines are not readily accessible as in other integrated circuits. Therefore, in order to expose the metal lines to the e-beam tester, one needs to employ a forced ion beam (FIB) to "drill" through the substrate and expose the metal lines. However, with the density of today's IC's, the active devices occupy much of the "real estate" available on the substrate, thereby rendering the use of FIB impossible. Therefore, the mechanism of light emission described above has been employed also for probing flip chips from the back side. The reader is directed to these three articles, published in the Proceedings of 1998 International Test Conference (ITC 98), Oct. 18-22, 1998, Washington, D.C., IEEE Catalog No. RSOO191:

Novel Optical Probing Technique for Flip Chip Packaged Microprocessors, Mario Paniccia, Travis Eiles, V. R. M. Rao and Wai Mun Yee.

Diagnosis and Characterization of Timing-Related Defects by Time-Dependent Light Emission, Dave Vallett, Leendert Huisman, and Phil Nigh.

Contactless Gigahertz Testing, W. Mertin, A. Leyk, U. Behrike. and V. Wittpahl.

Another article of interest is Picosecond Noninvasive Optical Detection of Internal Electrical Signals in Flip-Chip-Mounted Silicon Integrated Circuits, H. K. Heinrich, IBM J. Res, Develop. Vol 34, No. 2/3 1990.

Systems for imaging flip-chips from the backside through the silicon substrate are described in U.S. Pat. Nos. 5,208,648, 5,220,403 and 5,940,545.

However, in spite of the amount of work in the field, there is still no commercially viable system for device debug by time resolved measurements of hot electron emission, as opposed to device illumination. For example, one of the issues causing difficulties is the efficient collection of the faint light emission. Such an efficient collection requires highly accurate control and placement of the collection optics.

SUMMARY OF THE INVENTION

The present invention provides a landing system and method that enables accurate control and placement of the collection optics for a microscope.

In one aspect of the invention, a landing system is provided for an integrated system for testing an integrated circuit (IC). In this particular example, a solid immersion lens (SIL) is used for light collection, and the landing system is operated to place the SIL in contact with the IC.

In another aspect of the invention, the inventive system comprises a proximity sensor for determining the SIL's position with respect to the microscope's objective. In one particular implementation, the proximity sensor is a physical contact sensor, e.g., a strain gauge or a differential variable reluctance transformer (DVRT), attached to a z-motion stage. This arrangement is coupled to an x-y stage that is used to move the optics to the location of interest on the device under test. During the placement stage, the navigation is performed in steps and at each step the compression of the SIL is measured relative to its uncompressed state. When a measured compression exceeds a preset threshold, a SIL landing is recognized. In one example, after a landing is recognized, a further compression is imparted to the SIL in order to place the SIL in a focusing distance to the objective lens.

In yet another aspect of the invention, a SIL housing is movably mounted onto an objective lens housing. One part of a displacement sensor, e.g., a strain gauge or a differential variable reluctance transformer (DVRT), is attached to the SIL housing, while the other part is attached to the objective housing. This arrangement is coupled to an x-y-z stage that is used to move the optics to the location of interest on the device under test. During the placement stage, the navigation is performed in steps and at each step the motion of the SIL housing with respect to the objective housing is measured. When a measured motion exceeds a preset threshold, a SIL landing is recognized. In one example, after a landing is recognized, a further compression is imparted to the SIL in order to place the SIL in a focusing distance to the objective lens.

In a further aspect of the invention, a SIL housing is movably mounted onto an objective lens housing. The SIL housing is spring-loaded against the objective housing so as to impart a non-linear resistive force to compression of the SIL housing against the objective housing. A first linearly increasing force is imparted in a first compression range, defining a SIL landing range. Once the compression has surpassed the first compression range, indicating a SIL landing, a constant force is imparted over a second compression range, defining a focusing range. The variable source is provided by, for example, a non-linear spring, a dual-spring arrangement and the like.

According to a particular feature of the invention, the landing system is further provided with an interrupt to avoid damage to the SIL. The signal from the DVRT is fed to a Schmidt trigger that compares the signal to a preset limit. When that limit is exceeded, an interrupt signal shuts down the stage to prevent damage to the SIL.

BRIEF DESCRIPTION OF THE DRAWINGS

The invention is described herein with reference to particular embodiments thereof which are exemplified in the drawings. It should be understood, however, that the various embodiments depicted in the drawings are only exemplary and may not limit the invention as defined in the appended claims.

DETAILED DESCRIPTION

Figure 1A:
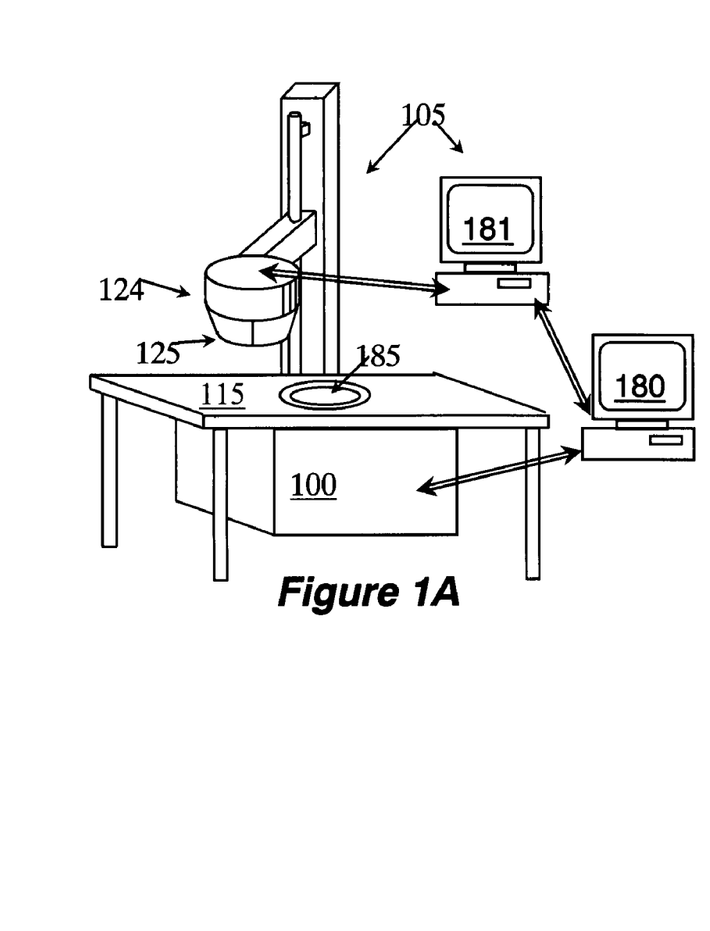
FIGS. 1A-1B are general schematics depicting the major components of a testing and debug system which may be used with the landing system according to embodiments of the invention.
Figure 1B:
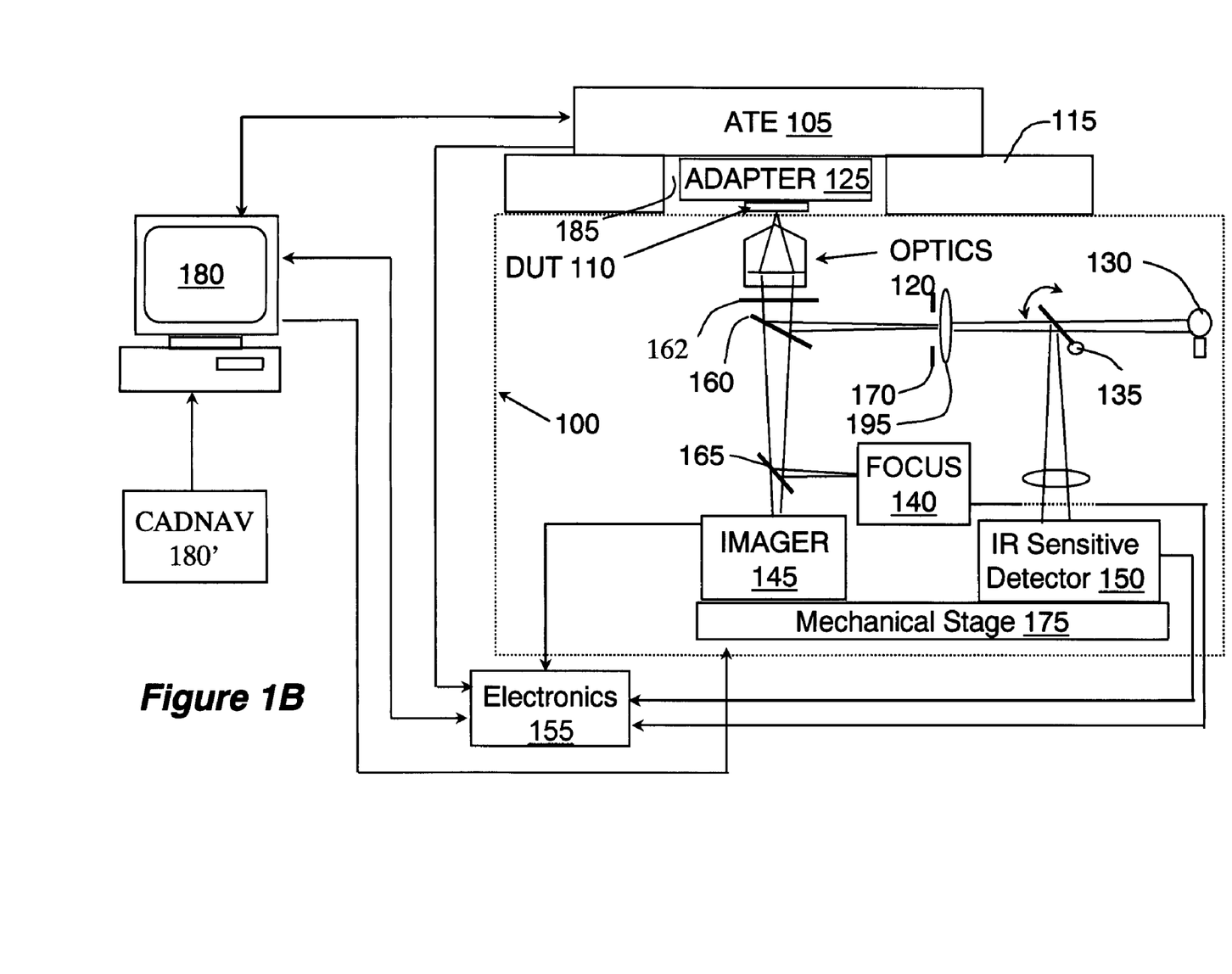

The present invention provides a landing system for a soft touchdown and accurate placing of collection optics of microscopes. The system can be used with various arrangements of collection optics, and is especially beneficial for use in microscopes designed for detection of faint light emissions. An example of such a microscope is depicted in FIGS. 1A and 1B, illustrating an IC test and debug system. Of course, the inventive landing system is suitable for use with other systems; however, for illustration purposes, various embodiments of the inventive landing system will be described with reference to the test and debug system of FIGS. 1A and 1B.

FIGS. 1A and 1B are general schematics depicting the major components of the testing and debug system particularly suitable for timing and other testing of microchips, especially from the backside through the substrate (e.g., flip chips). The system operates in conjunction with a commercially available automated testing equipment 105 (ATE). The ATE generally comprises a controller, such as a preprogrammed computer 181, and a test head 124 which comprises an adapter 125 used to deliver signals generated by the controller 181 to the device under test (DUT) 110 in a manner well known in the art. Specifically, the ATE is used to generate signals that stimulate the DUT to perform various tasks, as designed by the chip designer to check and/or debug the chip. The various signals generated by the controller 181 are delivered to the DUT via the adapter 125. The adapter 125 may include a space transformer, a DUT load board and a DUT socket, in a manner well known in the art.

In the embodiment depicted in FIGS. 1A and 1B, the ATE test head is placed on top of a vibration isolated test bench 115, while the chamber 100 that houses the entire optics, imaging and sensing system, and an X-Y-Z stage 175, is situated below. This provides a tremendous advantage as it allows the system to be used with any type and size of ATE without interference with, or making modification to any of the elements inside chamber 100. Rather, the ATE is used to place the DUT from above, so that it is visible to the optics 120 via opening 185. Stage 175 enables placing of the collecting optics at any locations within the opening 185.

The various elements of the system of FIGS. 1A and 1B will be described with reference to its operational modes. Generally, the system operates in two modes: navigation mode and detection mode. In the description, references to "navigation mode" should be understood to include navigation, target acquisition, and imaging. Therefore, these terms may be used interchangeably herein.

In the navigation mode, an illumination source 130 is used to illuminate the DUT. Illumination source 130 emits light in the infrared range using, for example, an IR laser, tungsten, or a halogen lamp. The light is focused onto and then reflects from the DUT to be collected by the collection optics 120 and selectively directed towards the imager 145 via quarter wave plate 162 and dichroic mirror 160. The imager 145 can be any two-dimensional detector capable of imaging in the infrared range, such as, for example, a silicon intensifier vidicon. IR vidicons are commercially available from, for example, Hamamatsu (http://usa.hamamatsu.com). Beam splitter mirror 165 is used to deflect part of the collected light to the focusing system 140. Alternatively, the signal of the imager 145 may be used for focusing.

The collection optics 120 may be connected to the x-y-z stage 175. During placing of the collection optics 120, the z motion is controlled using implementation of the present invention, as will be described in more detailed below.

The switchable mirror 135 selectively varies the optical path between the navigation and detection modes. For that purpose, mirror 135 may be mechanically moved or rotated, or it may be made of an active element capable of variable reflectivity according to the selected mode so that, for example, in one mode it is totally reflective, while in the other mode it is totally transmissive. For a rotational implementation, a substrate may be made having half of it transmissive and the other half reflective. Such a substrate can be provided with a rotating mechanism to insert in the optical path the reflective of transmissive part as desired.

Additionally, a mechanized aperture 170 is provided at the image plane of the collection optics 120, together with field lens 195. Notably, in this example, the image plane of collection optics 120 is generated in two locations: at aperture 170 and at the detector 145. The mechanized aperture 170 is illuminated from behind and is used to define the field of view at the image plane. That is, depending on the particular test to be run, one may wish to select any particular section of the DUT for emission. Using information about the chip design and layout stored in a CAD software, such as, for example, Cadence, and using navigation software, such as, for example, Merlin's Framework available from Knights Technology (www.electroglass.com), one may select a particular device for emission test. When the user selects a device or location, the system activates the stage 175 so that the collection optics is centered on the selected device or location. Then, the aperture 170 may be adjusted to increase or decrease the field of view as appropriate for the particular test desired.

When an appropriate field of view has been set and an image focused, mirror 135 is rotated so that the light path towards the JR sensitive detector 150 is established. Additionally, light source 130 is shut off or blocked during testing.

It should be appreciated, of course, that chamber 100 prevents any exterior light from reaching any of the optics, imagers and sensors enclosed within.

Photon sensing during testing is done by detector 150, which may be an infrared sensor, such as a photomultiplier tube (PMT), a photocathode coupled to a multichannel plate (MCP), an avalanche photodiode (APD), etc. The signal from the detector 150 is sampled by the high-speed data acquisition electronics 155. Controller 180, which may be a general-purpose computer running dedicated software, is used to control the various elements of the system, such as the stage and sampler. The controller 180 receives sync signals from the ATE 105.

Figure 4:
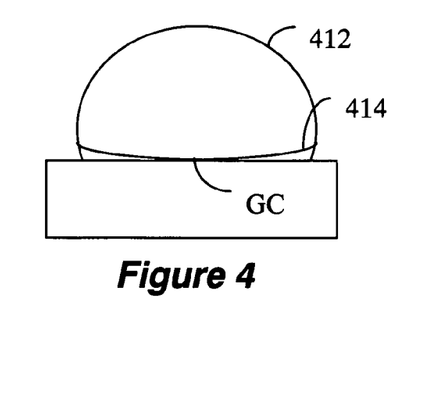
FIG. 4 depicts a bi-convex solid immersion lens that can be used with the landing system of the invention.

In order to maximize photon collection during testing, collection optics 120 includes a solid immersion lens (SIL). The SIL may be such as the ones disclosed in U.S. Pat. Nos. 5,004,307, 5,208,648 and 5,282,088, or any other suitable immersion lens. However, in this embodiment a novel bi-convex SIL is used. FIG. 4 depicts an embodiment of the bi-convex SIL 400. Specifically, the upper surface 412 is convex in the form of a hemisphere with radial geometrical center at GC. The bottom surface 414 is convex, but having a radius of curvature that is much larger than that of the upper surface. The radius of curvature of the bottom surface, 414, is, for example, at least an order of magnitude larger than that of the upper surface 412. The lowest point of the bottom surface, 414, passes through the radial geometrical center, GC, of the upper surface.

In usage, the lowest point on the bottom surface may come in contact with the object to be imaged 410, while the periphery of the bottom surface at a few tens of nanometers therefrom. However, lens 400 can also be used with a gap of up to about 200 nanometers from the object, wherein the gap is filled with either air or index matching material or fluid. In such a configuration, the periphery of the bottom surface would be a few tens of nanometers further from the object than the lowest point.

Since in the embodiment of FIG. 4 the bottom surface, 414, is convex, it has a small and defined "point of contact" with the object. Note that even if the lens does not contact the object, almost all of the radiation energy transmitted between the lens and the object would pass through the lowest point of the convex bottom surface 414 of the lens, which is loosely defined herein as the "point of contact." The small and defined point of contact allows for accurate determination of the point on the object that is being imaged. Also, by pressing the SIL against the DUT, the DUT may be deformed about the point of contact, thereby controlling the surface contact of the SIL and the amount of light collected.

Figure 2:
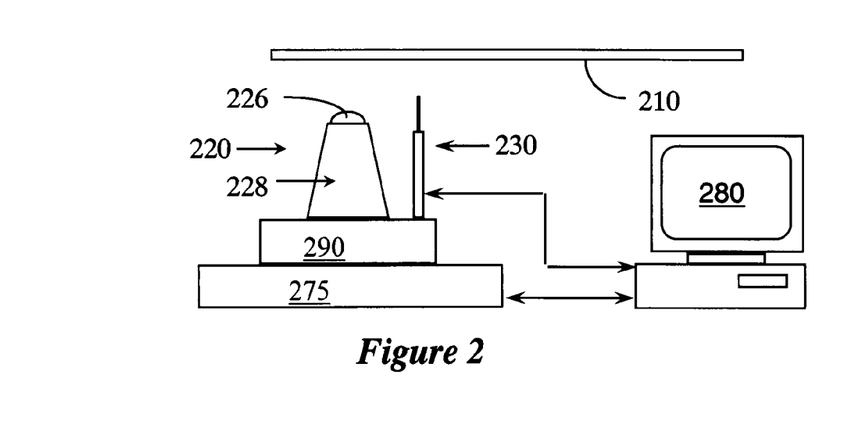
FIG. 2 depicts an embodiment of the landing system according to an embodiment of the invention.

FIG. 2 depicts an embodiment of the landing system of the present invention. Collection optics 220 is used to collect light from DUT 210. In this embodiment, collection optics 220 includes a SIL 226 and an objective lens inside housing 228. The collection optics is mounted to a z-axis actuator 290 of an x-y stage 275. The motion of the stage and actuator is controlled by a computer 280, which may be an all purpose computer programmed to perform specific tasks in accordance with embodiments on the invention.

A feature of this illustrative embodiment of the invention is that it controls the placement of the optics 220 with respect to the DUT 210. Advantageously, the depicted embodiment is capable of controlling a "soft" landing of the SIL 226 onto the DUT 210, and exerting a pre-specified pressure onto DUT 210 by the SIL 226. That is, as can be understood, until the SIL is "coupled" to the DUT, no image can be obtained, so there's no way to determine where the SIL is with respect to the DUT. (The term "coupled" means to allow communication of evanescent wave energy. In other words, the SIL is coupled to the DUT when it captures rays propagating in the DUT at angles higher than the critical angle. As is known in the art, the coupling can be achieved by, for example, physical contact with the imaged object or very close placement of up to about 200 nanometers from the object.) To that end, a physical contact sensor, e.g., a compression sensor or a strain gauge 230 is mounted onto the actuator 290 and/or housing 228 to serve as a proximity sensor so that the location of the STE with respect to the DUT can be determined. That is, in this embodiment the compression sensor 230 moves together with housing 228, so that its physical location is always known with respect to the STE 226.

Figure 5:
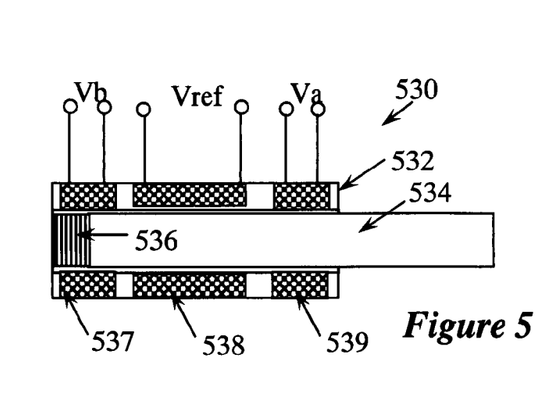
FIG. 5 depicts a differential variable reluctance transformer for use as a proximity sensor according to an embodiment of the invention.

In the illustrative embodiment depicted in FIG. 2, the compression sensor may be implemented in the form of, for example, a conventional strain gauge. Alternatively, a differential variable reluctance transformer DVRT may be used. More specifically, a DVRT in the form of an inverse solenoid may used. An example of a DVRT that can be used in the embodiment of FIG. 2 is depicted in FIG. 5, showing a magnetic core 534 that slides within a housing 532. The magnetic core 534 may be spring loaded by spring arrangement 536. The housing 532 houses a plurality of coils; in this embodiment one main coil 538 and two secondary coils 537 and 539. In this embodiment, Va and Vb are connected in series to secondary coils 537 and 539, respectively, but with opposite phase so that Va and Vb are subtracted from each other. When core 534 moves, the output voltage Vref changes and forms the output signal of the DVRT. Further information about DVRT and various circuitries can be found in the article entitled Accurate Linear Measurement Using LVDTs by George Novacek, which can be found at www.chipcenter.com/ernbapps/emba058.htm.

Figure 3:
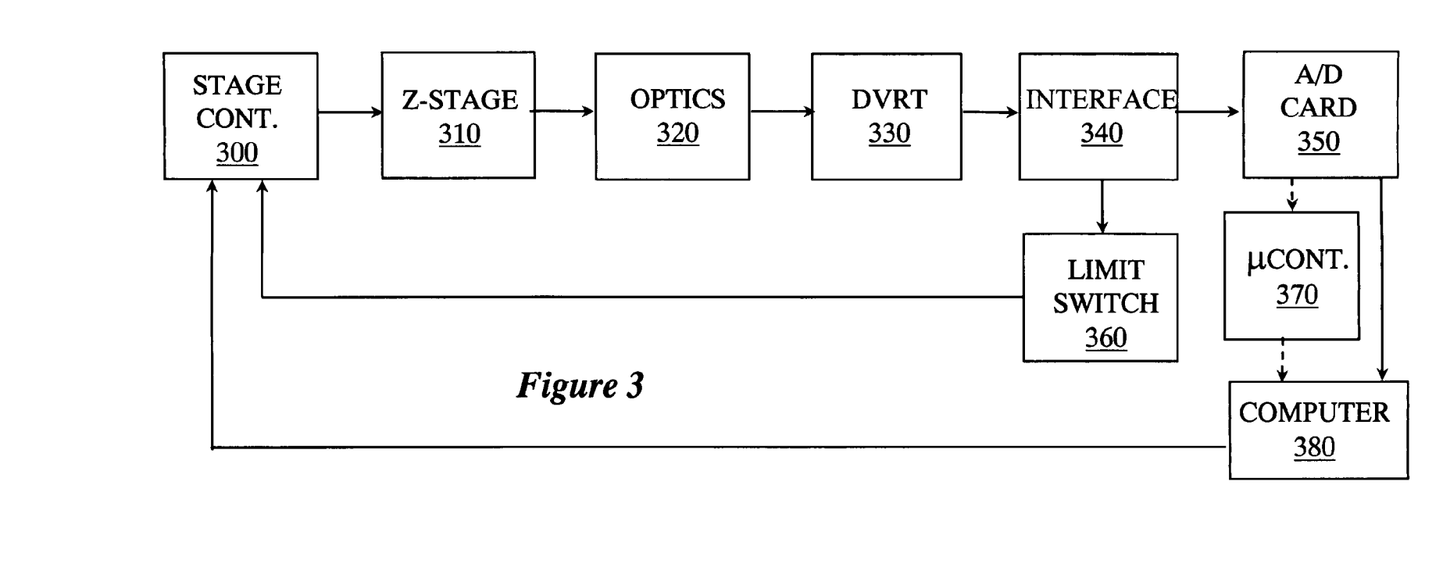
FIG. 3 depicts a block diagram of a landing system according to an embodiment of the invention.

According to an embodiment of the invention, the compression sensor is used to precisely place the SIL in contact, and under pressure, with the DUT. A block diagram of an embodiment of the inventive landing system that can be used for that purpose is depicted in FIG. 3. A stage controller 300 controls the motion of the stage actuators and the landing routine starts after the controller brings the optics 320 in x-y registration with the location on the DUT sought to be examined. Then, the controller advances the z-motion actuator towards the DUT in a step-wise motion to provide a "soft" landing of the SIL onto the DUT. After each step, typically 10 μm to 100 μm increment, the compression signal from the DVRT 330 is sent to the computer 380 via interface 340 and A/D card 350, either directly or through optional micro controller 370. The computer 380 compares the signal to the signal obtained from the DVRT when it is in its uncompressed state. In this manner, the computer recognizes when the SIL contacts the DUT. In one embodiment, the computer instruct the stage controller to perform z-motion steps until compression reading of the DVRT exceeds a preset value, typically 4 μm to 10 μm, at which point landing is recognized.

As demonstrated in FIG. 3, a safety feature is incorporated into this embodiment of the inventive system. Specifically, a hardware interrupt is provided to prevent damage to the SIL in case the stage controller moves the SIL beyond a set compression limit. In this example, this is done using a limit switch 360, for example, a Schmidt trigger, that receives the DVRT signal from the interface 340. The switch 360 compares the signal to a preset signal, e.g., a set potentiometer voltage. When the DVRT signal exceeds the preset signal, the stage is shut down via an external interrupt line that overrides the signal from the computer 380.

Figure 6:
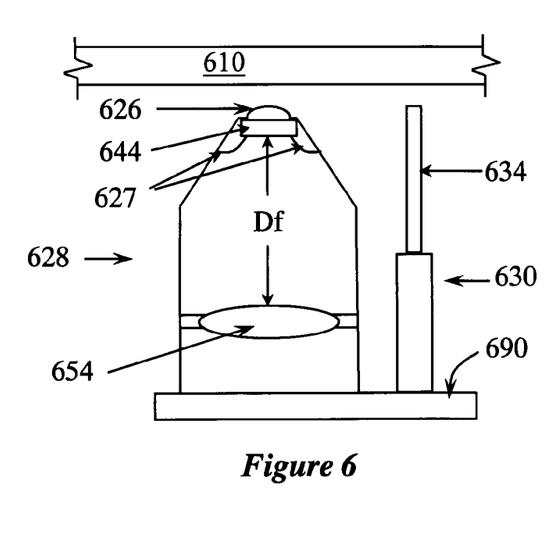
FIG. 6 depicts an arrangement of collection optics and proximity sensor according to an embodiment of the present invention.

A further feature of the inventive system is depicted in FIG. 6. In FIG. 6, the SIL 626 and an objective lens 654 are housed in collection optics housing 628. The SIL 626 is attached to bracket 644 that is spring loaded by springs 627. In this manner, the distance Df is variable and is used to perform focusing of the image. Specifically, once landing is detected, the computer 380 calculates a distance Df required for start of focusing routine. The distance is calculated by knowing the relationship between the position of the core 634 of the DVRT 630 and the SIL 626. That is, a calibration can be made beforehand, so that motion of the SIL in the Df direction is correlated with the output of the DVRT. The stage controller 300 then moves the optics 320 into start focusing position, which may be a further compression of up to, for example, 750 μm, but more typically 100-200 μm. In this example, the hardware limit is set to 750 μm, so if the computer sends a start of focus signal that requires a motion beyond 750 μm, the stage will be shut down by the switch 360. Of course, a check routine may additionally be implemented in computer 380 to check whether the calculated motion is beyond the switch limit and, if so, avoid sending the signal to the stage controller 300, but instead issue a warning to the user.

Figure 7:
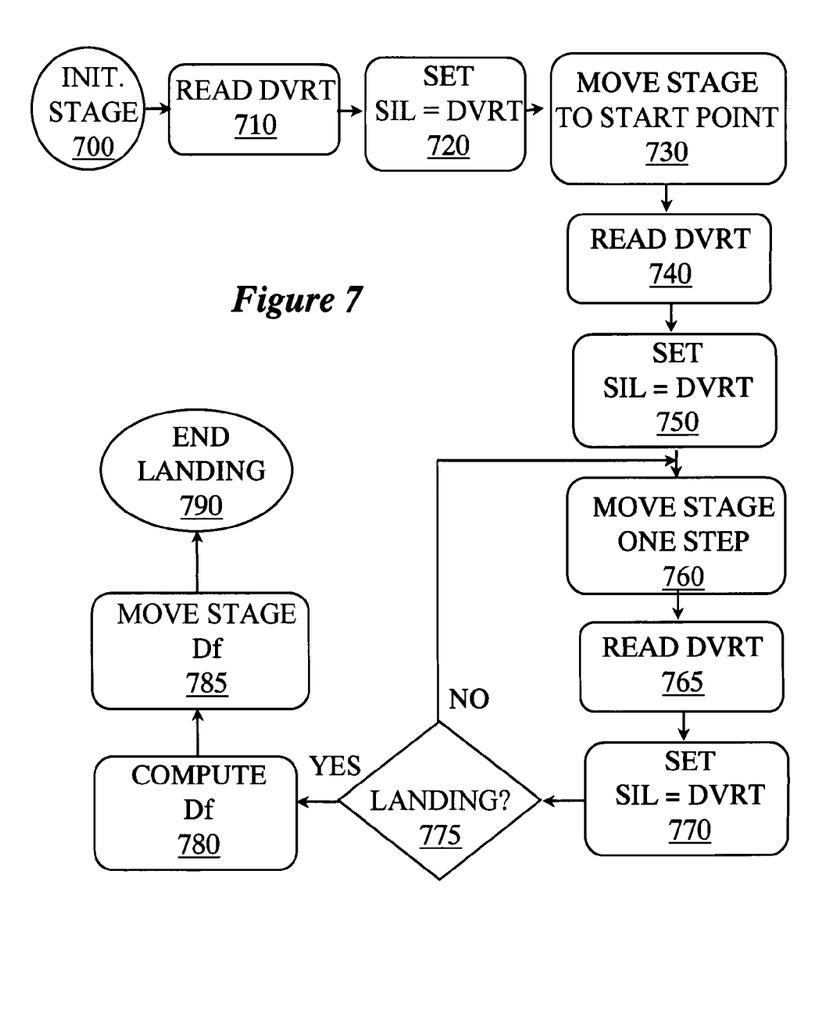
FIG. 7 is a block diagram of a routine of a method according to an embodiment of the invention.

FIG. 7 is a flow chart depicting a method for SIL landing according to an embodiment of the invention. This method may be implemented as a subroutine performed by a general purpose or a dedicated computer. The subroutine may be implemented in software, hardware, or a combination thereof. First, the routine initializes the stage (690, FIG. 6), reads the (uncompressed) DVRT output, and sets the SIL compression to equal the read DVRT output (steps 700, 710, and 720, respectively). Then, the routine moves the stage to the starting point for the landing (Step 730). In this embodiment, this starting point is a fixed z position of the collection optics with respect to the DUT (610, FIG. 6) to be investigated. This location may be entered manually by the user, or automatically using a pre-programmed routine. This starting location may be calculated to be, for example, 0.1-1.0 mm in front of the DUT, but typically about 0.5 mm. This may depend on factors such as uncertainty in the position of the DUT surface relative to the z-stage position, due to, for example, DUT surface irregularities, DUT mounting errors, and SIL housing uncertainty.

Once the system has stabilized in its starting point, optionally the computer again reads the DVRT (Step 740) and sets the SIL compression to the DVRT value (Step 750) in order to ensure accurate correlation between the SIL position and the DVRT compression. Then, the computer sends a signal to the controller to move the z-stage one step, reads the DVRT, and sets the SIL current position to the DVRT compression. (steps 760, 765 and 770, respectively). The routine then checks to see if landing has occurred (Step 775). This can be done by comparing the current DVRT reading to the initial or the previous one, or comparing the current DVRT reading to a compression signal Vref, as explained above with respect to FIG. 5. If no landing has been detected, the routine goes back to step 760 and performs another one step motion. If a landing has been detected, the routine calculates the SIL motion required to bring it to distance Df required for start of focusing operation (Step 780). This distance can be calculated from the known position of the SIL, obtained by correlating the DVRT reading. The computer then instructs the stage controller to move the stage in the z-direction the required amount so as to compress the SIL against the spring 627 until the appropriate distance Df has been achieved (Step 785). Then, the routine is completed (Step 790) and a hand-off to the focusing routine can be performed, or the user may be provided the option to perform manual focusing.

An optional step in the embodiment of FIG. 7 relates to the decision of landing. Specifically, in step 775, landing can be recognized only after it has been determined that the SIL has been compressed against springs 627 for a pre-determined distance. In one example, the distance is 4-10 μm. Thus, until the DVRT measurement shows that the compression exceeds this threshold, no landing is recognized and the routine goes back to step 760.

Figure 8:
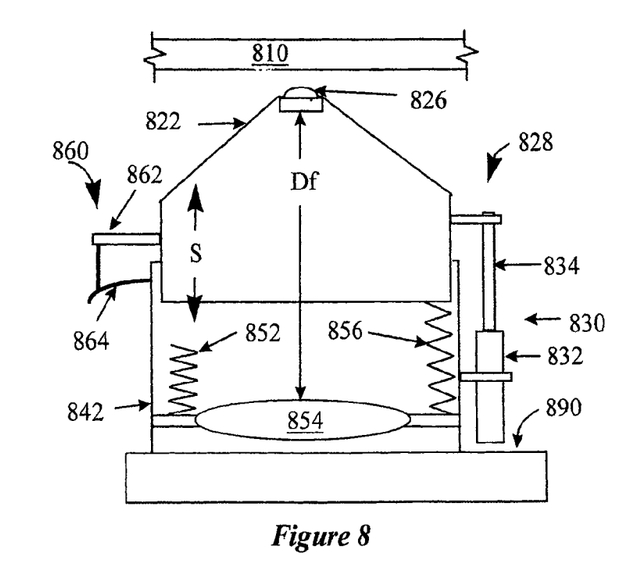
FIG. 8 depicts an arrangement of collection optics and proximity sensor according to an embodiment of the present invention.

Yet another embodiment is depicted in FIG. 8. In the embodiment of FIG. 8, the SIL 826 is fixedly attached to the SIL housing 822, and the objective lens 854 is fixedly attached to the objective housing 842 on base 890. The SIL housing 822 can slide with respect to the objective housing, as exemplified by arrow S. In this manner, the distance Df can be varied. To determine the position of the SIL with respect to the objective lens, a proximity sensor is provided. While any proximity sensor may be used, two alternatives, 828 and 860, are depicted as examples. In one example, a DVRT 830 is used, having its base 832 attached to the objective housing and its movable core 834 attached to the SIL housing. In this manner, any motion of the SIL housing 822 with respect to the objective housing 842 necessarily causes a motion of the core 834 with respect to the base 832 of the DVRT. Consequently, the readout of the DVRT can be correlated to the distance Df.

Another example of a proximity sensor is a strain gauge arrangement 860. A lever 862 is fixedly attached to the SIL housing 822, and is urged against a strain gauge 864. The strain gauge 864 is attached to the objective housing 842. When the SIL housing 822 slides towards the objective housing 842 the level 842 strains the strain gauge 864, so that its signal can be correlated to the position of the SIL housing 822. As can be understood, other proximity sensors may be used. For example, capacitive sensing system can be used to measure change in electrical capacitance as the SIL housing moves with respect to the objective housing. Similarly, optical system, such as, for example, an interferometer or change in light intensity, can be used to measure the SIL housing's motion. Accordingly, the term proximity sensor is meant to cover any such measurement system.

Figure 9:
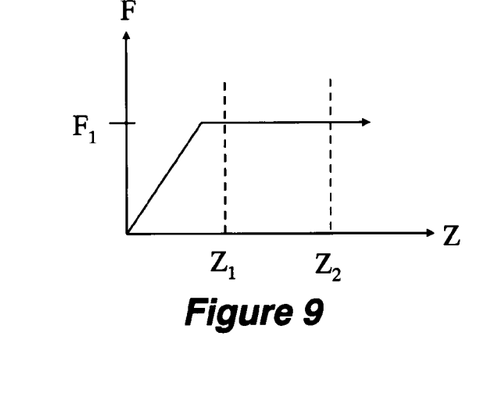
FIG. 9 is a force vs. distance graph for a spring load mechanism according to an embodiment of the invention.

A feature of the embodiment of FIG. 8 is the use of non-linear resistive force opposing the sliding of the SIL housing 822 towards the objective housing 842. This non-linear force can be provided by, for example, a non-linear spring, e.g., 856, or a combination of two linear springs, e.g., 856 and 852, having two different spring constants. What is sought to be achieved is depicted in FIG. 9, which is a graph of force vs. sliding distance, Z, of the SIL housing. As shown in FIG. 9, as the SIL housing starts to slide towards the objective housing 842, it first encounters a linearly increasing force which may be resulting from, for example, a linear spring 856. Once the SIL objective reaches a certain distance Z, the force is designed to be about constant. This can be achieved by the SIL housing urging against, for example, a second loaded spring 852.

In operation, the optics arrangement of FIG. 8 is advanced towards the DUT 810, either stepwise, as described above, or in continuous motion, until a landing is detected. The landing can be detected by a signal of the proximity sensor, for example, by sensing compression of the DVRT or the strain gauge. The optics arrangement is then further advanced so that the SIL is urged against the DUT with a force equal to the constant force F1. As exemplified in FIG. 9, the SIL housing then may be moved in the range Z1-Z2, which is the range where focusing is performed. Thus, using this embodiment, motion of the SIL to obtain various focusing distances Df does not result in different pressures exerted on the SIL.

Figure 10:
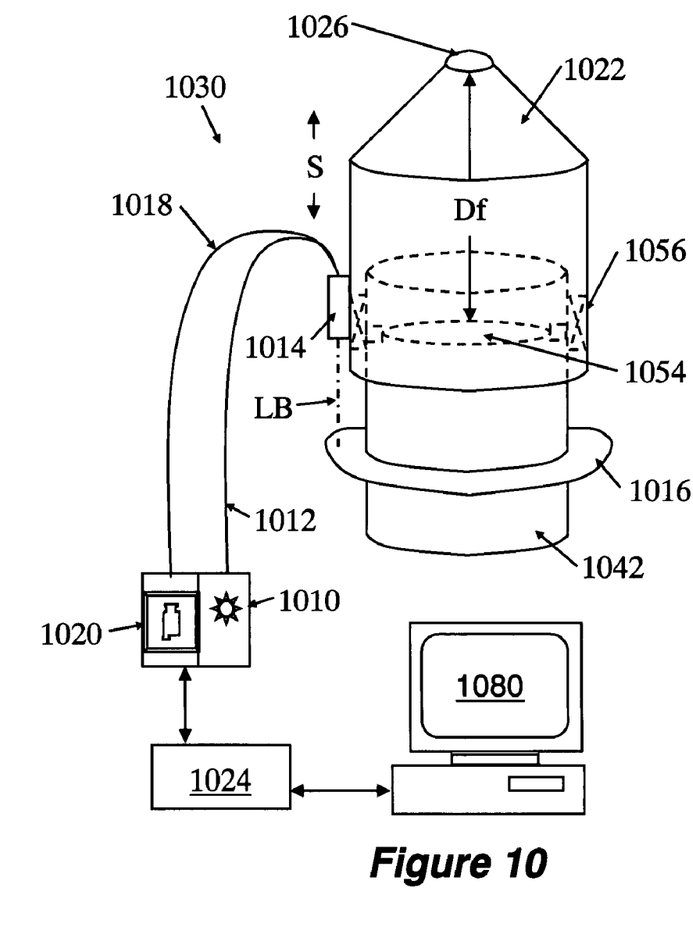
FIG. 10 depicts an arrangement of collection optics and proximity sensor according to another embodiment of the present invention.

As noted above, the proximity sensor may also be implemented in the form of an optical sensor. Such an embodiment is illustrated in FIG. 10. The embodiment of FIG. 10 uses a similar arrangement to the one illustrated in FIG. 8, inasmuch as SIL 1026 is fixedly attached to the SIL housing 1022, and the objective lens 1054 is fixedly attached to the objective housing 1042. The SIL housing 1022 can slide with respect to the objective housing 1042, as exemplified by arrow S, and may be spring loaded by spring 1056. In this manner, the distance Df can be varied. To determine the position of the SIL with respect to the objective lens, a proximity sensor is provided. In this arrangement the proximity sensor is a light reflection arrangement 1030. The light reflection arrangement 1030 is used to detect the motion of the SIL housing 1022 with respect to the objective housing 1042.

An embodiment of the proximity sensor in the form of a light reflection arrangement 1030 will now be described with respect to FIG. 10. In this embodiment, controller 1080 activates a light source 1010, e.g., an LED or laser diode, to emit light. The emitted light is collected by fiber optics 1012, having the output end thereof situated in a housing 1014, so as to emit a light beam LB. The light beam LB then reflects from mirror 1016. In this embodiment, the mirror 1016 is a polished "washer" that is physically affixed to the objective housing 1042. In this manner, the housing 1014 may be placed anywhere around the SIL housing 1022 and still illuminate the mirror 1016.

When the light beam LB hits the mirror 1016 it reflects back towards the housing 1014 and is being collected by fiber optics 1018, the output end of which is exposed to light sensor 1020, e.g., PMT, MCP, APD, etc. The output of the light sensor 1020 is provided to electronics 1024, which provides an intensity measurement of the received light. The intensity measurement is then provided to controller 1080. As can be understood, as distance Df becomes shorter, the light intensity collected by the fiber optics 1018 will increase. Thus, a correlation can experimentally be derived to associate intensity level to various distances Df.

The embodiment of FIG. 10 may be used in a method for SIL landing according to an embodiment of the invention as will be explained herein. This method may be implemented as a subroutine performed by a general purpose or a dedicated computer. The subroutine may be implemented in software, hardware, or a combination thereof. First, the routine initializes the stage, reads the reflected light intensity, and sets the SIL compression to equal the read intensity output. Then, the routine moves the stage to the starting point for the landing. In this embodiment, this starting point is a fixed z position of the collection optics with respect to the DUT to be investigated. This location may be entered manually by the user, or automatically using a pre-programmed routine. This starting location may be calculated to be, for example, 0.1-1.0 mm in front of the DUT, but typically about 0.5 mm. This may depend on factors such as uncertainty in the position of the DUT surface relative to the z-stage position, due to, for example, DUT surface irregularities, DUT mounting errors, and SIL housing uncertainty.

Once the system has stabilized in its starting point, optionally the computer again reads the intensity output and sets the SIL compression (i.e., Df) to the intensity value in order to ensure accurate correlation between the SIL position and the intensity reading. Then, the computer sends a signal to the controller to move the z-stage one step, reads the light intensity, and sets the SIL current position to the intensity value. (that is, compression steps are correlated to light intensity reading). The routine then checks to see if landing has occurred. This can be done by comparing the current intensity reading to the initial or the previous one, or comparing the current intensity reading to a intensity signal Iref (Iref can be determined experimentally). If no landing has been detected, the routine goes back to and performs another one step motion. If a landing has been detected, the routine calculates the SIL motion required to bring it to distance Df required for start of focusing operation. This distance can be calculated from the known position of the SIL, obtained by correlating the intensity reading. The computer then instructs the stage controller to move the stage in the z-direction the required amount so as to compress the SIL housing until the appropriate distance Df has been achieved. Then, the routine is completed and a hand-off to the focusing routine can be performed, or the user may be provided the option to perform manual focusing.

On the other hand, in embodiments where an index matching fluid is to be used, the focusing distance may be set as the "relaxed" position of the SIL housing 1022 with respect to objective housing 1042. Using the routine described above, after a landing has been recognized the computer ma instruct the z-stage to move the arrangement away from the DUT for, say 100 μm. In this manner, space is provided between the SIL and the DUT for the index matching fluid.

As can be understood, the features discussed above with respect to various embodiments can be easily employed in the embodiment of FIG. 10. For example, spring 1056 can provide linear or non-linear spring loading and may be a single or multiple spring or other resilient means arrangements. Similarly, a crush protection may be provided in various forms. For example, the landing system may be provided with an interrupt signal to avoid damage to the SIL. According to one implementation, the intensity signal is fed to a Schmidt trigger that compares the signal to a preset limit. When that limit is exceeded, an interrupt signal shuts down the stage to prevent damage to the SIL. Similarly, a lookup table can be constructed experimentally to define various alarm levels.

Figure 11:
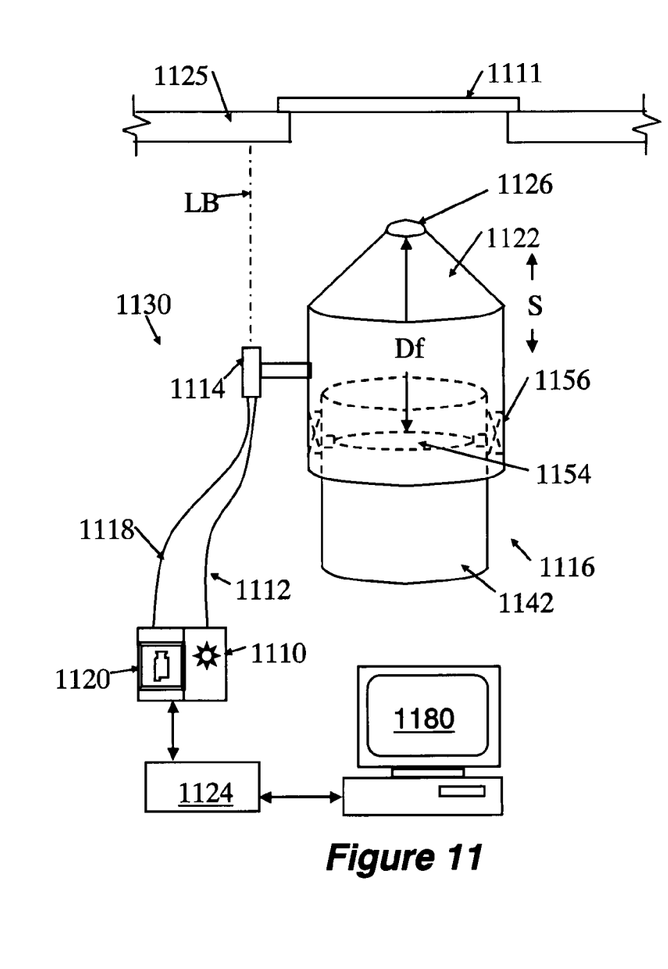
FIG. 11 illustrates another embodiment using an optical arrangement for the proximity sensor.

Another embodiment using an optical arrangement for the proximity sensor is illustrated in FIG. 11. The elements in FIG. 11 that are similar to those in FIG. 10 have the same numerical references, except that they are in the 1100's range. As can be seen, in this embodiment the light from the light source 1110 is transmitted by fiber optics 1112 and is made into a light beam LB that shines on the holder 1125 of the DUT 1111. At least part of the holder 1125 is made of a reflective material, so that the beam LB is reflected by the holder 1125. Part of the reflected light is collected by the fiber optics 1118 and sent to the optical sensor 1120, the output of which is sent to electronics 1124 to determine the intensity of the reflected light. As in the embodiment of FIG. 10, the measured reflected light intensity is correlated to distance: in this case the distance of the SIL 1126 to the DUT 1111.

As can be understood, the DUT 1111 is generally made of materials that can reflect light. Accordingly, the light beam LB can be made to shine on the DUT 1111, rather than on the holder 1125. As before, a lookup table can be constructed experimentally to correlate the light intensity to distance of the SIL from the DUT.

While the invention has been described with reference to particular embodiments thereof, it is not limited to those embodiments. Specifically, various variations and modifications may be implemented by those of ordinary skill in the art without departing from the invention's spirit and scope, as defined by the appended claims. For example, while the proximity sensor used in the various examples is in the form of a contact sensor, other techniques, such as, for example, optical interferometric techniques may be used. Additionally, all of the above-cited prior art references are incorporated herein by reference.

What is claimed is:

1. A collection optics arrangement integrating an objective lens and a solid immersion lens, comprising:
   an objective lens housing;
   an objective lens mounted inside said objective lens housing;
   a solid immersion lens (SIL) mounted to a tip of said objective lens housing at a distance Df from the objective lens, wherein the distance Df is controllably variable.

2. The arrangement of claim 1, further comprising a displacement sensor providing signals correlated to the motion of said solid immersion lens.

3. The arrangement of claim 2, wherein said displacement sensor comprises a physical contact sensor.

4. The arrangement of claim 2, wherein said displacement sensor comprises an optical sensor.

5. A collection optics arrangement integrating an objective lens and a solid immersion lens, comprising:
   an objective lens housing;
   an objective lens mounted inside said objective lens housing;
   a solid immersion lens (SIL) housing slidably mounted to said objective lens housing;
   a solid immersion lens mounted onto said SIL housing.

6. The arrangement of claim 5, wherein said SIL is fixedly attached to said SIL housing and said SIL housing is slidably-mounted resiliently to said objective housing.

7. The arrangement of claim 5, further comprising a spring loading said SIL housing.

8. The arrangement of claim 7, wherein said spring imparts a non-linear loading onto said SIL housing.

9. The arrangement of claim 5, further comprising a displacement sensor providing signals correlated to the motion of said solid immersion lens.

10. The arrangement of claim 9, wherein said displacement sensor comprises a physical contact sensor.

11. The arrangement of claim 9, wherein said displacement sensor comprises an optical sensor.

12. An optical microscope for viewing a specimen, comprising:
   vibration isolated test bench;
   a controllable stage coupled to said vibration isolated test bench;
   an objective lens housing coupled to the stage;
   an objective lens fixedly attached to said objective lens housing;
   a solid immersion lens housing slidably mounted onto said objective lens housing;
   a solid immersion lens attached to said solid immersion lens housing.

13. The optical microscope according to claim 12, further comprising a displacement sensor providing signals correlated to the motion of said solid immersion lens housing with respect to said objective lens housing.

14. The optical microscope according to claim 12, further comprising a controller receiving the signals from said displacement sensor and providing output signal for controlling said stage so as to place the solid immersion lens at a specific location on said specimen.

15. The optical microscope according to claim 14, wherein said displacement sensor comprises an optical sensor.

16. The optical microscope according to claim 15, wherein said displacement sensor comprises a light reflectance measuring system.

17. The optical microscope according to claim 12, further comprising coupling means for imparting a resistive force to sliding of said immersion lens housing with respect to said objective lens housing.

18. The optical microscope according to claim 12, further comprising coupling means for imparting a non-linear resistive force to sliding of said immersion lens housing with respect to said objective lens housing.

19. The arrangement of claim 1, further comprising a controller varying the distance Df to achieve focusing of the collection optics.

20. The optical microscope of claim 12, further comprising a controller controlling sliding of the SIL housing with respect to the objective lens housing to achieve focus of the microscope.

* * * * *